A. J. DAVIS
PROTECTIVE CIRCUIT FOR GERMANIUM AND SILICON RECTIFIER CELLS
Filed Nov. 29, 1957
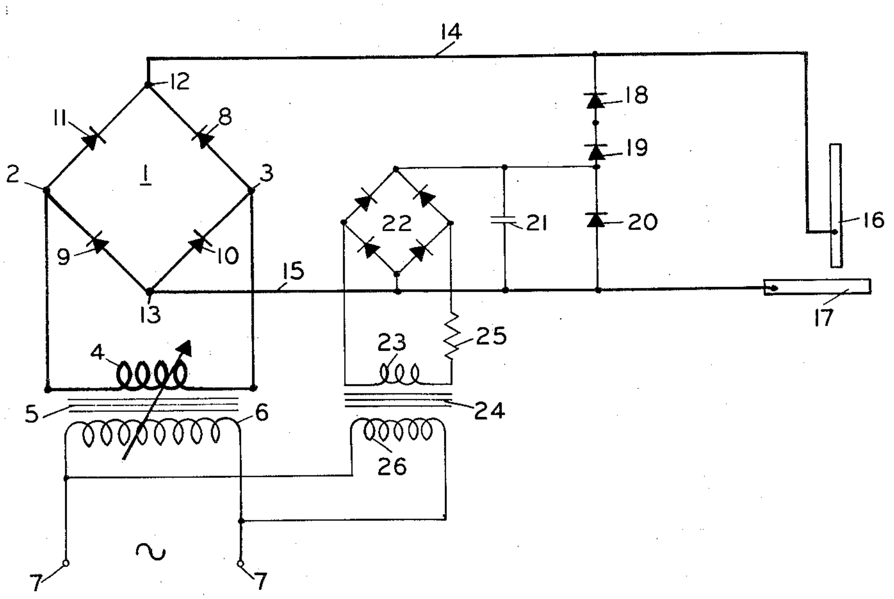
Inventor:
Andrew J. Davis
by Richard E. Hosley
His Attorney 2,969,494

PROTECTIVE CIRCUIT FOR GERMANIUM AND SILICON RECTIFIER CELLS

Andrew J. Davis, Hinsdale, Mass., assignor to General Electric Company, a corporation of New York Filed Nov. 29, 1957, Ser. No. 699,835

6 Claims. (Cl. 321—11)

My invention relates to a protective circuit for germanium and silicon rectifier cells and more particularly to a protective circuit for the power cells of a germanium or silicon rectifier welder used for supplying direct current to a welding arc from an alternating current source of supply.

Germanium and silicon are semi-conductors and have been conveniently classified as either positive (P-type), negative (N-type), or intrinsic (neither positive nor negative), depending primarily upon the type and sign of their predominant conduction carriers. According to prevailing theory, conduction in N-type material is primarily electronic; in other words, by means of the movement of free electrons, while conduction in P-type material is primarily by means of the movement of what has become known as "positive-holes" which arise from electron vacancies in the electronic system of atoms of the semiconductors.

It has been found that the determinant of whether a particular piece of semiconductor exhibits N- or P-type characteristics lies primarily in the type of impurity elements present in the semiconductor. Some impurity elements, termed "donors" function to furnish additional free electrons to the semiconductors so as to provide an electronic excess N-type semiconductor while other impurity elements, termed "acceptors" function to absorb the electrons to create P-type semiconductors with an excess of "positive-holes." Antimony, phosphorus, and arsenic are examples of "donor" impurities found in N-type germanium or silicon semiconductors while aluminum, gallium, and indium are examples of "acceptor" impurities for germanium or silicon semiconductors. Only very small amounts of these impurities are normally necessary to produce marked electronic characteristics of one type or the other.

Germanium and silicon rectifier cells are single-crystal P–N junction devices in which one end is of P-type with acceptor atoms and holes caused by missing electrons and the other end is of N-type with donor atoms and free electrons. When the P-type germanium or silicon is made negative, the P–N junction becomes highly resistant to current flow. When the P-type germanium or silicon is made positive, the P–N junction has a very low resistance to current flow. This asymmetric conduction results in the device acting as a rectifier.

In describing my invention with particularity, I will do so with regard to a germanium rectifier cell although the principles considered will apply equally well to a silicon rectifier cell as will be pointed out below.

The heart of a germanium rectifier cell is a small wafer of pure single-crystal germanium attached, in one commercial embodiment, between a layer of indium and a layer of tin or antimony. Rectification takes place between the alloyed layer of indium and germanium. Current passes freely from the indium to the tin or antimony side and is effectively blocked in the reverse direction. Germanium rectifier cells have an extremely low forward voltage drop and a comparatively very high reverse or back voltage resistance. These characteristics are maintained in the forward direction even at high current densities per square inch. In the reverse direction, great care must be taken not to exceed the back voltage rating of the cells since they are easily and permanently damaged if a certain critical back voltage is exceeded. Furthermore, germanium rectifier cells are temperature sensitive and have negative temperature coefficients. Consequently, high leakage current due to excess back voltage may contribute to a runaway condition by overheating the cells which will then fail by short-circuiting. Consequently, operation of a germanium rectifier cell at its high current capabilities imposes a major problem of protection.

The germanium wafer of a commercial rectifier cell has a thickness of the order of 0.020 to 0.010 inch and a circular cell one-half inch in diameter will transmit forward current of 75 amperes or more. As previously stated, the barrier layer exists between the indium and the germanium wafer and a reverse current of an ampere or less at a back voltage of 500 volts will be productive of a large quantity of energy which must be dissipated. This is usually accomplished by conductors or radiation from large plates which respectively engage the indium and the antimony or tin layers and constitute the terminals of the cell. With the best conduction or radiation condition possible, reverse current flows due to excessive back voltage will produce a rate of temperature rise at the barrier layer which will cause the rectifier to break down in a fraction of a second. It is consequently highly desirable to protect the rectifier cells from high leakage currents resulting from excess back voltages such as may occur in circuits of which the rectifier cell forms a part. In rectifier welders, such destructive reverse or leakage current flow may result from surge voltages from various sources such as switching surges from the power line and inductive surges from rapid cutoff of the welding current.

The germanium rectifier cell has a very high efficiency as compared with a copper oxide or a selenium rectifier cell and a rectifier welder containing germanium rectifier cells will be of smaller size and weight for equivalent output of the welder due to the high current conducting capacities of germanium rectifier cells as compared with copper oxide or selenium rectifier cells. Consequently, a germanium cell rectifier welder is possessed of desirable characteristics provided protection can be afforded against overloading due to forward or reverse current flow through the cells of the welder. Since most welders operate with a drooping direct current voltage characteristic, the load fault current problem does not exist and it is consequently desirable to provide protection only against reverse current flow due to transient conditions.

It is an object of my invention to provide a protective circuit for germanium and selenium rectifier cells which acts as a clipper or voltage limiter when excess back voltage appears across the rectifier cell.

It is a further object of my invention to combine this protective circuit with an arc force control circuit which operates to blast away short-circuiting metal droplets occurring in the welding arc and which might freeze the arc or cause sticking of the electrode to the work.

Further objects of my invention will become apparent from a consideration of the single embodiment thereof diagrammatically illustrated in the accompanying drawing.

The voltage limiting circuit portion of my invention is provided by using one or more series-connected selenium rectifier cells in shunt to and poled the same as the germanium rectifier cell which is to be protected against excessive back voltages. The structure of a selenium rectifier cell is different from that of a germanium rectifier cell. It comprises a base plate of steel or aluminum upon which a thin layer of selenium has been placed and suitably treated to change it into its crystalline form. A thin counterelectrode of a low melting point eutectic alloy is then applied over the selenium coating and a contact member of copper or brass makes a pressure engagement with the counterelectrode and serves as a terminal to carry the rectifier current away therefrom. The counterelectrode may be formed of an alloy of cadmium, bismuth, and tin. The barrier layer in a selenium rectifier cell may be formed between the selenium layer and the counterelectrode by means of an electro-forming process which comprises applying gradually built up back voltage to the cell while it is held at a controlled temperature.

A selenium rectifier cell has a characteristic similar to that of the germanium rectifier cell except that excessive reverse current flows through the cell at a lower back voltage than occurs in the germanium rectifier cell. Furthermore, the selenium rectifier cell is not destroyed by this leakage current flow therethrough since, in most cases where complete breakdown and sparking occur, a circular hole is burned in the counterelectrode of the cell and the molten selenium forms a film around the edge of the hole, thus insulating it and clearing the short circuit. Therefore, except for the rare instances when a failure occurs directly under the copper or brass terminals pressing on the counterelectrode of the cell, the fault is self-healing. In those instances where the fault is not self-healing, the selenium cell may be replaced at small cost compared to the cost of replacing a destroyed germanium rectifier cell.

The selenium cell clipper circuit of my invention may conveniently be combined with an arc force control by means of which a surge of current is supplied to the welding arc to blast away molten globules of metal in the arc stream when these globules tend to short-circuit the arc and cause the electrode to freeze to the work. This arc force control may conveniently comprise a capacitor which is charged to a voltage less than the normal voltage of the operating arc and which is connected across the welding leads through a plurality of series-connected selenium rectifier cells which prevent charging of the condenser from the welding conductors to the open-circuit voltage across these conductors. Thus, when the arc voltage falls below a pre-determined value, which is the voltage of the charged capacitor, the capacitor will discharge through the selenium cells into the welding circuit and supply the surge of voltage needed to clear the molten globules of metal from the arc stream.

If a rectifier is connected across the capacitor provided for arc force control, it will be in series connection with the selenium blocking rectifiers forming part of the arc force control circuit and this additional selenium rectifier cell in combination with the other selenium rectifier cells connected in series therewith across the welding conductors will constitute the protective circuit employed in accordance with my invention for preventing excess back voltages across the germanium cells of a rectifier bridge or network used for supplying direct current to the welding arc from an alternating current source of supply.

The embodiment of my invention shown in the drawing comprises a rectifier bridge 1 having its input terminals 2, 3 connected to the secondary 4 of an adjustable leakage transformer 5 having a primary winding 6 connected to a source of alternating current supply 7 of commercial frequency. Each arm of the rectifier bridge is completed through a germanium rectifier cell 8, 9, 10, or 11. The output terminals 12 and 13 of the rectifier bridge are connected through welding circuit conductors 14 and 15 to the electrode 16 and the work 17 forming a cooperating electrode. The germanium rectifier cells of the bridge rectifier are protected against excess back voltages by a blocking selenium rectifier cell circuit including the series-connected selenium rectifier cells 18, 19, and 20.

The capacitor 21 forming part of the arc force control is connected across the welding circuit conductors 14 and 15 through the selenium blocking rectifier cells 18 and 19. This capacitor is charged to a voltage slightly less than the operating voltage of the welding arc by means of a rectifier bridge 22 having its output terminals connected across the capacitor and its input terminals connected to the secondary 23 of an auxiliary transformer 24 through a current-limiting resistor 25. The primary 26 of the auxiliary transformer 24 is connected to the source of supply 7.

By supplying alternating current energization to the input terminals 2, 3 of the rectifier bridge 1 through a transformer 5 having an adjustable leakage, the direct current output characteristic of the rectifier at its terminals 12, 13 will have a drooping volt-ampere characteristic such as is normally employed for the usual arc welding operation. By adjusting the reactance of transformer 5, the amount of current supplied to the arc during welding may also be controlled. Energization of the auxiliary transformer 24 will also apply a direct current charge to the capacitor 21 and the voltage transformation in transformer 24 is selected so that the voltage of capacitor 21 is slightly less than the normal voltage of a welding arc established between the electrodes 16 and 17. When the voltage at the arc drops below its normal operating value, the capacitor 21 will discharge through rectifier cells 18 and 19 and supply to the welding circuit 14, 15 the necessary current for blasting from the arc stream the molten globules of arc metal which have produced the drop in arc voltage. At this time, the output terminals of rectifier 22 are also connected to the welding circuit and the presence of resistor 25 in the input circuit to the rectifier limits the amount of current that may be supplied through rectifier 22 to the arc welding circuit. It is obvious that rectifier cells 18 and 19 block any application of voltages across the welding conductors 14 and 15 which is greater than the normal arc voltage and that the number of cells 18 and 19 must be chosen in accordance with the magnitude of the voltage that is to be blocked.

By connecting a selenium rectifier cell 20 across the capacitor 21 and by using selenium rectifier cells for the rectifier cells 18 and 19, a shunt circuit is provided about the germanium rectifier cells in the arms of the rectifier bridge 1. Thus, when germanium rectifier cells 8 and 9 are conducting, the selenium rectifier cells 18, 19, and 20 are connected across germanium rectifier cells 10 and 11 and are poled in the same direction as those cells. Thus, excess back voltages due to transients that might appear across germanium rectifier cells 10 and 11 also across the series-connected selenium rectifier cells 18, 19, and 20. These rectifier cells 18, 19, and 20 have a characteristic which causes excess back current to flow through them at a voltage less than the voltage required to cause an excess reverse current flow through germanium rectifier cells 10 and 11 and the amount of current thus conducted increases at a rapid rate as the back voltage increases and consequently will absorb instantaneously a magnitude of current which will hold down the surge voltage and thus protect the germanium rectifier cells 10 and 11. It is of course possible that the very rapid increase through cells 18, 19, and 20 may approach a break-down value which will result in melting a hole in the counterelectrode of one or more of the selenium cells but, as pointed out above, the molten selenium formed at this time will produce a film around the edge of this hole thus insulating it and clearing the short circuit. It is of course apparent that, when germanium rectifier cells 11 and 10 are conducting to supply current to the arc, the series-connected selenium rectifier cells 18, 19, and 20 act in the manner just described to protect the germanium rectifier cells 8 and 9 against any excess back voltage that might otherwise appear across them during the welding operation.

The single-phase circuit shown in the drawing will not, in most instances, be used as an operating welding circuit because of its low efficiency and the pulsating nature of the direct current supplied. Ordinarily, two or more leakage reactance transformers 5 and bridges 1 will be employed to supply current to the welding conductors 14 and 15 from two or more phases of a polyphase source of alternating current supply to different phases of which the input terminals 7 of the transformers 5 will be connected.

The arrangement illustrated may be suitable for transforming an alternating current voltage to an 80-volt open-circuit direct-current voltage across the welding conductors 14 and 15 and the selenium rectifier cells 18, 19, and 20 may each have a rating of 33 volts R.M.S. The capacitor 21, having a value of 8,000 microfarads or thereabouts, may be charged to 32 volts by transformer 24 acting through rectifier 22. Generally, the resistor 25 may be of about one-ohm value. With this arrangement of parts, the selenium rectifier cells 18, 19, and 20 in their series connection will have an operating voltage of about 140 volts and will start conducting a sizeable amount of leakage current at about 200 volts. The leakage current through these selenium rectifier cells 18, 19, and 20, as the voltage is increased above 200 volts across the welding conductors 14, 15, will soon reach a region of instability until a trigger point is approached where the gain through the cells tends to become infinite. The instantaneous magnitude of current which must be absorbed through these selenium rectifier cells 18, 19, and 20 to hold down any surge voltage appearing as a back voltage across a germanium rectifier cell is quite high. It may well be of the same order of magnitude as the rated current of the welder. Consequently, the cells 18, 19, and 20 must be of fairly large plate area in order to provide sufficient transient heat-absorbing capacity. I have employed selenium rectifier cells having plate dimensions of 6¼" x 7¼".

It is of course apparent that, if an arc force control is not to be employed, the blocking selenium rectifier cell circuit connected in shunt to a germanium rectifier cell may be nothing more than the circuit of the series-connected selenium cells 18, 19, and 20 which is connected across the welding circuit 14, 15.

As mentioned above, my invention is not limited to the protection of germanium rectifier cells but is also applicable to the protection of silicon rectifier cells which have a P–N junction structure like that described above for the germanium rectifier cell. The melting point of silicon is considerably higher than that for germanium and most phenomena which occur in germanium cells also occur in silicon cells but at higher temperatures. For example, the reverse current in a silicon rectifier cell begins to be appreciable only at a higher temperature than in a germanium rectifier cell or, in other words, the reverse current in a silicon rectifier cell at ordinary temperatures is extremely small. Furthermore, break-down in a silicon rectifier cell also occurs at a higher temperature and it is consequently possible to operate a silicon rectifier cell at two or three times the peak inverse voltage possible with a germanium rectifier cell. It is also apparent that instead of using power germanium or silicon P–N junction rectifier cells, a cell of an allow of these two metals may be used.

Instead of using an adjustable leakage transformer for supplying alternating current to the power rectifier bridge or network, it is of course apparent that other arrangements may be employed such as using a low leakage reactance transformer which is connected to the input terminals of a rectifier bridge through a fixed or adjustable reactance device. It is also possible to secure the drooping volt-ampere characteristic in the welding circuit by using an adjustable resistor therein; but, since this is wasteful of energy, the more usual arrangement will use the leakage reactance transformer or its equivalent.

It is also apparent that my invention is not limited to protecting P–N junction rectifier cells of germanium and silicon which form part of a welder circuit since the same circuit arrangement may be employed for protecting these silicon and germanium rectifier cells wherever they are employed under conditions which subject them to reverse current voltages that are productive of reverse current flows which will destroy them. Thus, in its broadest sense, my invention is of general application to circuits which are exemplified by the welder circuit shown in the drawing.

Other applications and modifications of my invention will become apparent to those skilled in the art and I consequently intend to cover by the appended claims all such modifications as come within the true spirit and scope of my invention.

What I claim as new and desire to secure by Letters Patent of the United States is:

1. Apparatus comprising a P–N junction rectifier cell of the type employing a single crystal selected from the group consisting of germanium and silicon, a circuit including said P–N junction rectifier cell and in which it is subjected to destructive back voltages, and a blocking selenium cell rectifier circuit connected in shunt to said P–N junction rectifier cell, the back voltage rating of said selenium cell rectifier circuit being less than a predetermined value which will produce destructive reverse current flow through said P–N junction rectifier cell.

2. Apparatus comprising a rectifier bridge having an alternating current input circuit and a direct current output circuit and having in each arm of said bridge a P–N junction rectifier cell of the type employing a single crystal selected from the group consisting of germanium and silicon, and a plurality of selenium rectifier cells connected in series circuit with one another across said output circuit of said rectifier bridge, said selenium rectifier cells being poled to block current flow across said output circuit of said bridge rectifier and having collectively a back voltage rating which is productive of a substantial reverse current flow therethrough when the voltage across said output circuit of said bridge rectifier is greater than a predetermined value.

3. Apparatus comprising a rectifier bridge having an adjustable reactance alternating current input circuit and a direct current output circuit and having in each arm of said bridge a P–N junction rectifier cell of the type employing a single crystal selected from the group consisting of germanium and silicon, and a plurality of selenium rectifier cells connected in series circuit with one another across said output circuit of said rectifier bridge, said selenium rectifier cells being poled to block current flow across said output circuit of said bridge rectifier and having collectively a back voltage rating which is productive of a substantial reverse current flow therethrough when the voltage across said output circuit of said bridge rectifier is greater than a predetermined value.

4. Arc welding apparatus comprising an adjustable reactance alternating current transformer having a primary winding and a secondary winding, a rectifier bridge having input terminals connected to said secondary winding of said transformer and welding circuit conductors respectively connected to the direct current output terminals thereof, said rectifier bridge having in each arm thereof a P–N junction rectifier cell of the type employing a single crystal selected from the group consisting of germanium and silicon, a capacitor, means for charging said capacitor to a voltage less than the voltage of a welding arc supplied through said welding circuit conductors, means including series-connected selenium rectifier cells for conductively connecting the respective positive and negative terminals of said capacitor to said welding circuit conductors of corresponding polarity, said selenium rectifier cells having a combined rating and being poled to prevent charging of said capacitor from said welding circuit conductors when subjected to the open-circuit voltage thereof, and a selenium rectifier cell connected across said capacitor and poled to prevent discharge of said capacitor.

5. Arc producing apparatus comprising an adjustable reactance alternating current transformer having a primary winding and a secondary winding, a rectifier network having input terminals connected to said secondary winding of said transformer and direct current output terminals current conductors respectively connected to the direct current output terminals of said rectifier network for delivering direct currents to an arc producing apparatus, said rectifier network comprising P–N junction rectifier cells of the type employing a single crystal selected from the group consisting of germanium and silicon, a capacitor, means for charging said capacitor to a voltage less than the voltage of an arc supplied through said current conductors, means including series connected selenium rectifier cells for conductively connecting the respective positive and negative terminals of said capacitor to said current conductors of corresponding polarity, said selenium rectifier cells having a combined reverse voltage rating which is less than the reverse voltage rating of said rectifier network and being poled to prevent charging of said capacitor from said current conductors when subjected to the open-circuit voltage thereof, and a selenium rectifier cell connected across said capacitor and poled to prevent discharge of said capacitor.

6. Apparatus comprising a rectifier network having an alternating current input circuit and a direct current output circuit for delivering currents to a load and having in its respective arms P–N junction rectifier cells of the type employing a single crystal selected from the group consisting of germanium and silicon, said network having a combined reverse voltage rating which if exceeded will produce destructive reverse current flow through said P–N junction rectifier cells, and a plurality of selenium rectifier cells connected in series circuit with one another across said output circuit of said rectifier network, said selenium rectifier cells being poled to block current flow across said output circuit of said rectifier network and having collectively a reverse voltage rating which if exceeded will produce a substantial non-destructive current flow therethrough, said collective reverse voltage rating of said series connected selenium rectifier cells being less than said reverse voltage rating of said rectifier network.

References Cited in the file of this patent

UNITED STATES PATENTS

| | | |
|---|---|---|
| 1,784,004 | Geiger et al. | Dec. 9, 1930 |
| 2,208,933 | Loewenhaupt | July 23, 1940 |
| 2,837,703 | Lidow | June 3, 1958 |
| 2,854,651 | Kircher | Sept. 30, 1958 |